(12) United States Patent
Andoh

(10) Patent No.: US 7,199,402 B2
(45) Date of Patent: Apr. 3, 2007

(54) SEMICONDUCTOR DEVICES

(75) Inventor: Hideyuki Andoh, Saitama-ken (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/013,087

(22) Filed: Dec. 7, 2001

(65) Prior Publication Data
US 2002/0127890 A1 Sep. 12, 2002

(30) Foreign Application Priority Data
Dec. 12, 2000 (JP) .................................. P2000-377379

(51) Int. Cl.
*H01L 29/40* (2006.01)

(52) U.S. Cl. .................. 257/104; 257/355; 257/501

(58) Field of Classification Search ............ 257/157, 257/570, 577, 341, 288, 339, 408, 342, 593, 257/149, 606, 163, 169, 551, 603, 162, 167, 257/378, 330, 377, 46, 104, 109, 355, 356; 323/313; 438/151, 149, 148, 147, 121
See application file for complete search history.

(56) References Cited

U.S. PATENT DOCUMENTS

| | | | | |
|---|---|---|---|---|
| 4,258,311 A | * | 3/1981 | Tokuda et al. | 323/313 |
| 4,264,857 A | * | 4/1981 | Jambotkar | 323/226 |
| 4,293,868 A | * | 10/1981 | Iizuka et al. | 257/577 |
| 4,956,690 A | * | 9/1990 | Kato | 257/157 |
| 6,579,772 B2 | * | 6/2003 | Andoh | 438/328 |
| 6,639,301 B2 | * | 10/2003 | Andoh | 257/606 |
| 2002/0070380 A1 | * | 6/2002 | Andoh | 257/46 |
| 2002/0072207 A1 | * | 6/2002 | Andoh | 438/526 |
| 2002/0127890 A1 | * | 9/2002 | Andoh | 438/983 |

FOREIGN PATENT DOCUMENTS

| | | |
|---|---|---|
| GB | 1382730 | 2/1975 |
| JP | 48-35865 | 10/1973 |
| JP | 48-74171 | 10/1973 |
| JP | 50-48882 | 5/1975 |
| JP | 58-085572 | * 5/1983 |
| JP | 10-294473 | 11/1998 |

* cited by examiner

*Primary Examiner*—Laura M. Schillinger
(74) *Attorney, Agent, or Firm*—Kilpatrick Stockton LLP

(57) ABSTRACT

The present invention provides a semiconductor device embracing (a) a first semiconductor region defined by a first end surface, a second end surface opposing to the first end surface and a side boundary surface connecting the first and second end surfaces; (b) a second semiconductor region connected with the first semiconductor region at the second end surface; (c) a third semiconductor region connected with the first semiconductor region at the first end surface; and (d) a fourth semiconductor region having inner surface in contact with the side boundary surface and an impurity concentration lower than the first semiconductor region. The fourth semiconductor region surrounds the first semiconductor region, and is disposed between the second and third semiconductor regions. The first, second and fourth semiconductor regions are first conductivity-type, but the third semiconductor region is a second conductivity type.

7 Claims, 6 Drawing Sheets

SEMICONDUCTOR DEVICES

BACKGROUND OF THE INVENTION

1. Field of the Invention

The present invention relates to a semiconductor device, which may be used as, for example, a semiconductor rectifying element having a constant reverse breakdown voltage such as a voltage regulator diode (Zener diode), and a manufacturing method thereof.

2. Description of the Related Art

A voltage regulator diode 1 as shown in FIG. 1 is known. The semiconductor diode (hereinafter referred as "an earlier semiconductor diode") 1 has the simple three-layer structure embracing, for example, n-type semiconductor layer 2 of high impurity concentration, n-type semiconductor layer 3 and p-type semiconductor layer 4 of high impurity concentration, formed in silicon substrate. And, metal films 5,6 which respectively serves as the ohmic electrodes have been deposited on the top surface of n-type semiconductor layers 2 and on the bottom surface of p-type semiconductor layers 4.

Generally, in a chip outer-surface, at which the termination of pn junction, implemented in the earlier semiconductor diode with such stacked geometry, is exposed, a high electric field is induced along the depletion layer of pn junction between which the reverse-bias voltage was applied. However, by receiving the effect of impurity elements and ions adsorbed on the surface, etc., the electric field at the outer-surface is further intensified locally, and the breakdown phenomena become frequent. Therefore, the reverse breakdown voltage theoretically expected is not obtained in the earlier semiconductor diode. Then, the appropriate bevel structure is adopted in order to reduce the electric field at the chip outer-surface, by cutting obliquely the outer-surface of the earlier semiconductor diode 1, where the pn junction interface is exposed. By adopting such bevel contour, the electric field at the chip outer-surface 7 is reduced, and the breakdowns are designed to occur along whole junction interface contained inside of the semiconductor chip, attempting the stabilization of the breakdown behavior. Still, the fact that breakdown voltage is also improved further by adopting the bevel structure in power semiconductor devices having higher maximum operating voltages than the voltage regulator diode such as the Zener diode is well known.

SUMMARY OF THE INVENTION

The earlier semiconductor diode 1, however, has problems as explained below:

(a) For the earlier semiconductor diode 1, to protect the chip outer-surface 7 from the effects of outside environment in an assembling process the chip outer-surface 7 is coated with an insulation film 8 as shown in FIG. 1 after employing wet cleaning by acid or alkali chemicals. However, for the semiconductor diode manufactured in such a way, it is pointed out from the result of product evaluation tests that performance and quality of the product is not stable. The reasons for instability in the performance are given that changes in the surface state and surface failure occur on the chip outer-surface 7 under influence of the wet cleaning or coating of the insulation film 8. Since the surface state of actual semiconductor chips is very active, it is very difficult to control the precision and reproducibility of such surface state.

(b) The earlier semiconductor diode 1 has the n-type semiconductor layer 3 having impurity concentration much lower than that of the p-type semiconductor layer 4, and in the case that it can be considered a one-sided abrupt junction, avalanche breakdown voltage at the pn junction part of the n-type semiconductor layer 3 with the p-type semiconductor layer 4 is determined by impurity concentration of the n-type semiconductor layer 3. Accordingly, it was required to control highly accurately resistivity ρ of a semiconductor (silicon) wafer to be used for a product. This means that a semiconductor wafer regulated in a strict specification for the resistivity ρ was required to be manufactured by a semiconductor wafer manufacturer under a special order and tested after the delivery. In the past, silicon wafers with a narrow range of 0.01 to 0.03 Ω·cm in resistivity ρ—for the n-type silicon, it corresponds with a range of $5 \times 10^{18}/cm^3$ to $7 \times 10^{17}/cm^3$ in impurity concentration—were used for the order specification.

(c) For manufacturing of the earlier semiconductor diode 1, since the chip outer-surface 7 has the bevel structure formed aslant to the pn junction interface, there is a problem that the number of processes required increases since processes such as sandblasting, grinding, polishing or etching are added in order to form the bevel structure.

(d) For the earlier semiconductor diode 1, since the chips cut from the semiconductor wafer are in a packed state and have its side face inclined aslant to the front and back surfaces of the chips, the device geometry makes it difficult to mount the chip on a jig such as collet in an assembling process.

In view of these situations, it is an object of the present invention to provide a semiconductor device having a stabilized breakdown performance, with a desired breakdown voltage, by preventing the local breakdown, which would be generated at the chip outer-surface, where the terminal portion of the pn junction is exposed.

Another object of the present invention, is to provide a semiconductor device and manufacturing method thereof, which allows for a reduction in cost of the semiconductor wafer and allows for the range of allowable resistivity ρ of the semiconductor wafer employed as a raw material, to be widened.

Still another object of the present invention is to provide a semiconductor device manufacturing method, which allows chip surface passivation processing to be simplified or to be abbreviated.

Still another object of the present invention is to provide a semiconductor device and a manufacturing method thereof, which allows the manufacturing process to be simplified.

Yet still another object of the present invention is to provide a semiconductor device allowing for favorable handling and favorable loading of the chip into a jig, such as the collet, during the product assembly process.

In order to solve the aforementioned problems, a first aspect of the present invention inheres in a semiconductor device embracing (a) a first semiconductor region of a first conductivity type, defined by a first end surface, a second end surface opposing to the first end surface and a side boundary surface connecting the first and second end surfaces; (b) a second semiconductor region of the first conductivity type connected with the first semiconductor region at the second end surface; (c) a third semiconductor region of a second conductivity type connected with the first semiconductor region at the first end surface; and (d) a fourth semiconductor region having inner surface in contact with the side boundary surface and an impurity concentration lower than the first semiconductor region, configured such that the fourth semiconductor region surrounds the first semiconductor region, the fourth semiconductor region is disposed between the second and third semiconductor regions. Here the second conductivity type is the opposite conductivity type as the first conductivity type. More specifically, if the first conductivity type is assigned to be n-type, then the second conductivity type is p-type; and if the first conductivity type is assigned to be p-type, then the second conductivity type is n-type. For example, two pn junction interfaces may be implemented by bringing both a high impurity concentration n-type first semiconductor region and relatively low impurity concentration n-type fourth semiconductor region into contact with a p-type third semiconductor region. The localized pn junction interface between the first and third semiconductor regions may be referred as "the first pn junction interface" hereinafter. Another pn junction interface between the fourth and third semiconductor regions may be referred "the second pn junction interface" hereinafter. Alternatively, another configuration in which a high impurity concentration p-type first semiconductor region and a relatively low impurity concentration p-type fourth semiconductor region may be brought into contact with an n-type third semiconductor region to provide first and second pn junction interfaces is also allowable. The side boundary surface may be a curved surface including one, two, or more certain radii of curvature.

The semiconductor device according to the first aspect of the present invention makes it easier for a breakdown to occur in the first pn junction between the first and third semiconductor regions than in the second pn junction between the fourth and third semiconductor regions positioned at the outer edge side of the semiconductor device (semiconductor chip). As a result, the electric field at the sidewall (chip sidewall) of the semiconductor device is reduced, and a breakdown is made to occur in the first pn junction interface within the semiconductor device to allow stabilization in the breakdown behavior. The stabilization in the breakdown voltage is, for example, more effective in a power semiconductor device having a higher maximum operating voltage than in a voltage regulator diode.

In the semiconductor device according to the first aspect of the present invention, it is preferable for the fourth semiconductor region to be a semiconductor substrate cut from bulk crystal. By adjusting the impurity concentration of the first semiconductor region, the electrical characteristics of the semiconductor device can be controlled making it so that the impurity concentration of the fourth semiconductor region does not influence the electrical characteristics of the semiconductor device. As a result, it is possible to use the fourth semiconductor region with the doping specifications of the wafer (semiconductor substrate) as it is when it is cut from the bulk crystal at the time of purchase. Namely, there is no longer any need to strictly set the doping specifications of the semiconductor substrate and it is possible to widen the range from which the semiconductor substrate (wafer) to be used may be chosen.

In the semiconductor device according to the first aspect of the present invention, the outer surfaces of the fourth semiconductor region serves as the chip outer-surface of the semiconductor device, and it is preferable that the chip outer-surface be substantially orthogonal with the second end surface of the first semiconductor region. In the case where the fourth semiconductor region has a first conductivity type, the outside pn junction interface is exposed at the chip outer surface. However, since the breakdown at the first pn junction occurs earlier in the central portion than at the second pn junction disposed at the edge portion, even if there are some changes in the surface state or surface damage occurs in the outer surfaces of the semiconductor device, it is possible to suppress variations in the breakdown voltage of the semiconductor device. In particular, the breakdown of the earlier pn junction exposed at the edge portion of the chip (the chip outer surface) is dependent on the passivation architecture of the chip outer surface and "variations" in the breakdown voltage at the edge portion of the earlier chip was large. However, with the semiconductor device according to the first aspect of the present invention, since the breakdown occurs earlier in the first pn junction confined in the central portion than the chip outer surface, even if there are some changes in the surface state or surface damage occurring at the edge portion of the semiconductor device (chip), it is possible to suppress fluctuations in the breakdown voltage of the semiconductor device. Accordingly, variations in the product performance are reduced, and manufacturing process yield is improved.

Moreover, since the chip outer-surface is made substantially orthogonal with the first end surface of the first semiconductor region, it is possible to form sidewall of the semiconductor device with a typical cutting process, or the standard dicing process. "Substantially orthogonal" means within the range of variations of angle developing during a typical cutting process (dicing process), and intentionally means that beveling is not performed. For example, if an 80° to 100° angle is formed, this can be seen as being substantially orthogonal (=90°). It is preferable that an 87° to 93° angle be formed. If the chip outer-surface is substantially orthogonal with the edge surfaces, the handling of the semiconductor device (chip) during a fabrication (assembly) process using a jig, such as the collet, is improved.

In the first aspect of the present invention, it is preferable that a first main electrode layer be formed at the bottom surface of the third semiconductor region, and a second main electrode layer be formed at the top surface of the second semiconductor region. With the first main electrode layer and the second main electrode layer, the principal operational region, which is the main current path of the semiconductor element, is identified. "The first main electrode layer" may mean either an anode electrode layer or a cathode electrode layer in the semiconductor diode or a thyristor. The thyristor is capable of including a gate turn-off (GTO) thyristor or a static induction thyristor (SI thyristor). If the third semiconductor region is assigned to be n-type, then the first main electrode layer is a cathode electrode layer. "The second main electrode layer" may mean either a cathode electrode layer or anode electrode layer in the semiconductor diode or thyristor, but not the above-mentioned first main electrode layer. If the second semiconductor region is assigned to be p-type, then the second main electrode layer is an anode electrode layer. As a result, the third semiconductor region serves as a "first main electrode region" contacted to the first main electrode layer, and the second semiconductor region serves as a "second main electrode region" contacted to the second main electrode layer.

Moreover, the "first main electrode layer" may be either an emitter electrode layer or a collector electrode layer in a bipolar transistor (BJT) or an insulated-gate bipolar transistor (IGBT). A BJT may include an high frequency transistor such as a hetero-junction bipolar transistor (HBT), which operates in the microwave band, the millimeter-wave band or sub-millimeter-wave band. Moreover, the present invention may be applicable to an insulated-gate field effect transistor (IGFET) such as a metal-oxide-semiconductor field effect transistor (MOSFET), metal-oxide-semiconductor static induction transistor (MOSSIT), or high electron mobility transistor (HEMT). In this IGFET, the "first main electrode layer", means either a source electrode layer or a drain electrode layer. In addition, in a BJT or an IGBT, the "second main electrode layer" may mean either an emitter electrode layer or a collector electrode layer, but not the above-mentioned first main electrode layer; and in an IGFET, it may either mean a source electrode layer or drain electrode layer, but not the above-mentioned first main electrode layer. It is noted that in a BJT, an IGBT, an IGFET, or the like, it is also, of course, allowable to further add a control electrode layer for the base electrode layer, the gate electrode layer, or the like.

A second aspect of the present invention inheres in a method of manufacturing a semiconductor device embracing (a) preparing a semiconductor substrate defined by a first main surface a second main surface opposing to the first main surface; (b) forming a first semiconductor region by selectively doping first conductivity type impurity elements through a diffusion window disposed on the second main surface to a predetermined diffusion depth; (c) forming a second semiconductor region by doping the first conductivity type impurity elements through entire first main surface; and (d) forming a third semiconductor region by doping second conductivity type impurity elements through entire second main surface so as to form a pn junction with the first semiconductor region. Here it is allowable for either the step of forming the first semiconductor region or the step of forming the second semiconductor region to be performed first. The semiconductor substrate surrounding the first semiconductor region and remaining as the base material corresponds to the fourth semiconductor region mentioned in the first aspect.

According to the method of manufacturing a semiconductor device according to the second aspect of the present invention, a first semiconductor region can be formed within the semiconductor substrate by selectively doping the first conductivity type impurity elements through a first main surface of the semiconductor substrate. This first semiconductor region is so formed that it achieves a higher impurity concentration than the fourth semiconductor region surrounding this first semiconductor region.

In the case where the semiconductor substrate is the n-type, for example, the first and second pn junction interfaces may be implemented by bringing the high impurity concentration n-type first semiconductor region and the relatively low impurity concentration n-type semiconductor substrate (fourth semiconductor region) into contact with the p-type third semiconductor region, respectively. Therefore, it is possible for a breakdown to occur earlier in the first pn junction between the first and third semiconductor regions, than the second pn junction between the fourth and third semiconductor regions. As a result, the electric field at the sidewall (chip sidewall) of the semiconductor device is reduced, and a breakdown is made to occur in the localized first pn junction interface deeply confined within the semiconductor device, allowing for stabilization of the device performance ascribable to the constant breakdown voltage.

In addition, by adjusting the impurity concentration of the first semiconductor region, it is possible to determine the electrical characteristics of the semiconductor device, and it is possible for the impurity concentration of the fourth semiconductor region to not have influence on the electrical characteristics of the semiconductor device. As a result, the semiconductor substrate can be utilized with the impurity concentration of the purchased specifications without requiring rigid setting of the impurity concentration. Therefore, it is possible to widen the range, from which the semiconductor substrate to be selected.

In the method of manufacturing a semiconductor device according to the second aspect of the present invention, it is preferable that there further include a process of dicing a plurality of semiconductor chips by cutting the semiconductor substrate along planes substantially orthogonal with the first pn junction interface formed between the third and first semiconductor region, and obtaining a plurality of semiconductor devices from the respective plurality of semiconductor chips. In this case, by adhering either one of the first and second main surface of the semiconductor substrate to a synthetic resin sheet and then cutting the chips without cutting the adhered synthetic resin sheet, it is possible to store and transport each chip while still being adhered to the synthetic resin sheet. As a result, during product assembly, it becomes easier to handle the semiconductor device adhered to the synthetic resin sheet, for example, when loading into a jig such as the collet.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

DETAILED DESCRIPTION OF THE EMBODIMENTS

Figure 1:
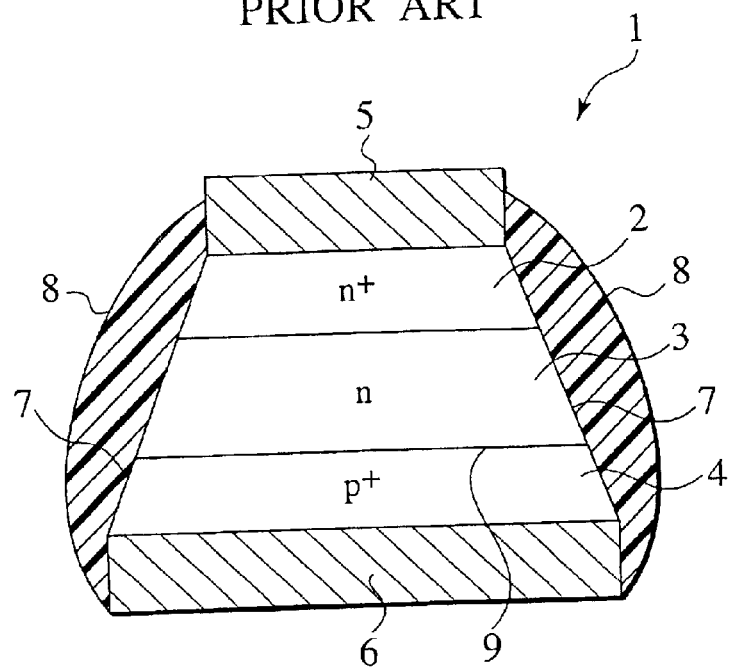
FIG. 1 is a cross-sectional view showing the earlier semiconductor device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one FIG. to another nor inside a given FIG, and in particular that the layer thicknesses are arbitrarily drawn for facilitating the reading of the drawings.

In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set fourth in detail in order not unnecessary obscure the present invention.

Prepositions, such as "on", "over", and "under" are defined with respect to a planar surface of the substrate, regardless of the orientation the substrate is actually held. A layer is on another layer even if there are intervening layers. It being understood the indicator "+" in the figures indicates relatively strong doping and the indicator "−" in the figures indicates relatively weak doping.

(Semiconductor Device)

Figure 2:
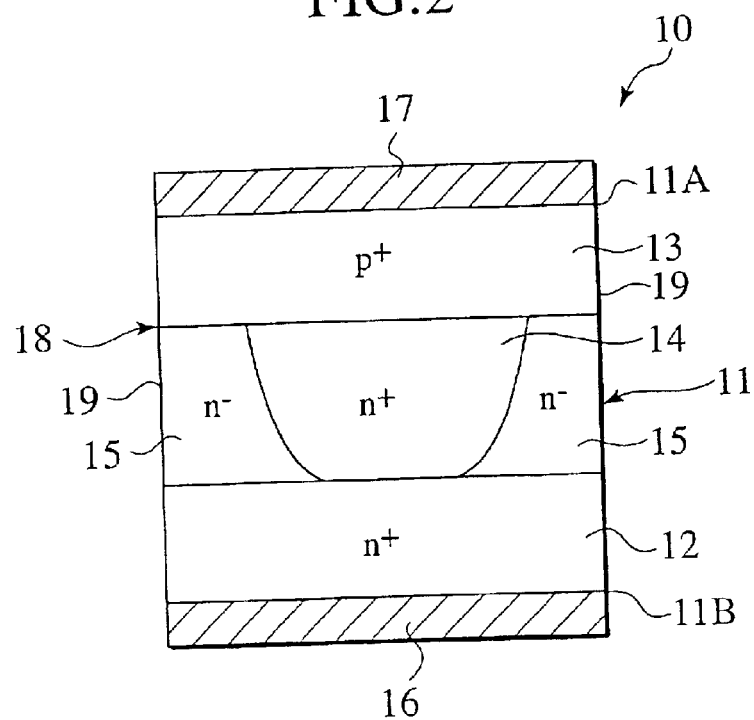
FIG. 2 is a simplified cross-sectional view showing a semiconductor device according to the embodiment of present invention.

As shown in FIG. 2, a voltage regulator diode 10, as the semiconductor device according to the embodiment of present invention, embraces a first semiconductor region 14, defined by a first end surface, a second end surface opposing to the first end surface and a side boundary surface connecting the first and second end surfaces; a second semiconductor region 12 connected with the first semiconductor region 14 at the second end surface; a third semiconductor region 13 connected with the first semiconductor region 14 at the first end surface; and a fourth semiconductor region 15. The fourth semiconductor region 15 has an inner surface in contact with the side boundary surface and an impurity concentration lower than the first semiconductor region 14. Although the fourth semiconductor region 15 surrounds the first semiconductor region 14, the fourth semiconductor region 15 is disposed between the second semiconductor region 12 and the third semiconductor region 13. In addition, a first main electrode layer 16 is formed on a bottom surface of the second semiconductor region 12, and a second main electrode layer 17 is formed on a top surface of the third semiconductor region 13. Here, the first semiconductor region 14, the second semiconductor region 12 and the fourth semiconductor region 15 have a first conductivity type, but the third semiconductor region 13 has a second conductivity type opposite to the first conductivity type.

In the embodiment of present invention, the first conductivity type is assigned to be n-type, and the second conductivity type is p-type, for example, as shown in FIG. 2. Therefore, a localized first pn junction interface 18 is formed between the n-type first semiconductor region 14 and the p-type third semiconductor region 13. And peripheral second pn junction interface 18 is formed between the n-type fourth semiconductor region 15 and the p-type third semiconductor region 13. The fist and second pn junction interfaces implement a single flat pn junction interface 18 as shown in FIG. 2. Between the first main electrode layer 16 and the second main electrode layer 17, the principal operation region of the semiconductor device, or the current path for the main current flowing through the semiconductor device is defined. "The first main electrode layer 16" can be assigned to be one of the anode electrode layer and the cathode electrode layer. In FIG. 2, first main electrode layer 16 is assigned to be the cathode electrode layer, since the second semiconductor region 12 has n-type conductivity. Similarly, "the second main electrode layer 17" can be identified as the other one of the anode electrode layer and the cathode electrode layer being not identified as the first main electrode layer 16. In FIG. 2, since the third semiconductor region 13 has p-type, the second main electrode layer 17 is assigned to be the anode electrode layer. Then, the second semiconductor region 12 and the third semiconductor region 13 serve as "the first main electrode region" being contacted with the first main electrode layer 16, and "the second main electrode region" being contacted with the second main electrode layer 17, respectively. In FIG. 2, the second semiconductor region 12 is identified as the cathode region, and the third semiconductor region 13 is identified as the anode region, respectively. Then, the main current flows between the first main electrode layer 16 and the second main electrode layer 17 so as to make the resistance through the current path lower in the structure of FIG. 2. In the semiconductor device 10 (the voltage regulator diode) according to the embodiment of present invention, the outer-surface of fourth semiconductor region 15 serves as the chip outer-surface 19 of the semiconductor device 10, as it is shown in FIG. 2, and the chip outer-surface 19 is substantially vertical to the first surface of the first semiconductor region 14. At the chip outer-surface 19, the termination of the second pn junction interface 18 is exposed.

The fourth semiconductor region 15 is the semiconductor substrate 11 (silicon substrate), or the silicon wafer sliced from bulk crystal of FZ, CZ and MCZ method, etc. In other words, the n-type second semiconductor region 12 is formed at the first main surface 11B side, and the p-type third semiconductor region 13 is formed at the second main surface 11A side of silicon substrates 11. Then, the n-type first semiconductor region 14 is formed in the central region between the second semiconductor region 12 and third semiconductor region 13. In addition, the n-type fourth semiconductor region 15 is disposed between the second semiconductor region 12 and the third semiconductor region 13 so as to surround the side boundary surface of the first semiconductor region 14.

The second semiconductor region 12 is doped with first conductivity type (n-type) impurity elements, such as phosphorus (P), arsenic (As), up to the high impurity concentration (for example, about $2 \times 10^{19}/cm^3$) from second main surface 11A side of silicon substrates 11.

The third semiconductor region 13 is doped with second conductivity type (p-type) impurity elements such as boron (B), up to the high impurity concentration from second main surface 11A side of silicon substrates 11.

Similarly, the first semiconductor region 14 is doped with first conductivity type element (donor), such as arsenic (As) and phosphorus (P), up to the high impurity concentration. Then, the n-type fourth semiconductor region 15 having low impurity concentration, which is inherent to the silicon substrate 11, surrounds the side boundary surface of the first semiconductor region 14. The term "inherent to the silicon substrate 11" means that the initial impurity concentration of purchased silicon wafer, which is identical to the impurity concentration specification of the bulk crystal is used as the impurity concentration for the n-type fourth semiconductor region 15. As this result, the n-type first semiconductor region 14 is set at higher impurity concentration than the impurity concentration of the n-type fourth semiconductor region 15, which surrounds it.

In the semiconductor diode 10 of the embodiment, the p-type third semiconductor region 13 has the uniform impurity concentration along the direction in parallel with the first and second pn junction interfaces 18. However, the impurity concentration of the n-type first semiconductor region 14, which joins to the p-type third semiconductor region 13, is made higher than the n-type fourth semiconductor region 15, which surrounds the n-type first semiconductor region 14, as above mentioned. Therefore, it is possible to cause the breakdown in the deeply localized first pn junction in advance, the deeply localized first pn junction is formed between the p-type third semiconductor region 13 and the top surface ( or the first end surface) of the n-type first semiconductor region 14, when the reverse-bias voltage was applied along the first and second pn junctions. The localized first pn junction is disposed and confined in the inner side of the substrate 11. That is to say, in this embodiment, by generating the breakdown in the localized inner region, even if there is a part in which the second pn junction interface is exposed outside, the breakdown of the first pn junction would not taken the burden of surface field intensity at the exposed second pn junction. As this result, it becomes possible that the surface treatments, which will include the wet cleaning, such as with the acid or the alkali based chemicals, and the surface passivation processing by depositing an insulating film so as to protect the chip outer-surface 19 from the external environment, are reduced in the manufacturing process of the semiconductor diode 10 of the embodiment. Further, the handling of the semiconductor device (chip) 10 during fabrication (assembly) process is improved, since the slight surface defects, surface scratches or surface failures generated at the chip outer-surface 19 will not affect the breakdown behavior.

In addition, with the semiconductor diode 10 of the embodiment, the breakdown voltage of the centrally-located first pn junction between the buried n-type first semiconductor region 14 and the p-type third semiconductor region 13 can be determined according to the impurity concentration NB of the n-type first semiconductor region 14. If it is assumed that the first pn junction interface 18 between the p-type third semiconductor region 13 and the n-type first semiconductor region 14 implements a one-sided abrupt junction, then the breakdown voltage VB due to the avalanche breakdown can be given as:

$$V_B = \in_S E_m^2/(2qN_B). \tag{1}$$

wherein, $\in_S$ is the dielectric constant of the semiconductor substrate, $E_m$ is the maximum electric field intensity inherent to the semiconductor substrate over which the avalanche breakdown is induced, q is the elementary electric charge of the electron, and $N_B$ is the impurity concentration of the first semiconductor region 14. Namely, if the impurity concentration $N_B$ of the first semiconductor region 14 is sufficiently higher than the impurity concentration of the silicon wafer 11, or more specifically the impurity concentration of the fourth semiconductor region 15, then the breakdown voltage of the semiconductor diode 10 is dependent on only the impurity concentration $N_B$ of the first semiconductor region 14 and not dependent on the impurity concentration of the base material (silicon wafer) 11 used in manufacturing process. As a result, if the impurity concentration $N_B$ of the first semiconductor region 14 is appropriately prescribed in accordance with Eq. (1), and this impurity concentration $N_B$ is maintained, then it is not necessary to precisely control the resistivity ρ of the silicon wafer 11 since the desired breakdown voltage can be obtained. Accordingly, if the substrate 11 has a relatively high resistivity compared to the resistivity of the buried first semiconductor region 14, just corresponding to the impurity concentration $N_B$ of the buried first semiconductor region 14, any appropriate commercially available silicon wafer 11 may be used to manufacture a voltage regulator diode 10 having a desired breakdown voltage.

According to the embodiment, it is possible to use for the silicon wafer 11 having resistivity within the wide range of 1 to 250 Ω·cm (with n-type silicon, corresponding to an impurity concentration in the range of approximately $5.5 \times 10^{15}/cm^3$ to $1.8 \times 10^{13}/cm^3$). Moreover, in the case of a power semiconductor device having higher maximum operating voltage, the silicon wafer 11 having resistivity ρ within the wide range of 1000 Ω·cm or higher (with n-type silicon, corresponding to an impurity concentration in the range of approximately $5 \times 10^{12}/cm^3$ or lower) may be used.

In addition, in the semiconductor diode 10 of the embodiment, since the chip outer-surface 19 is cut from the silicon wafer 11 so that it make the substantially vertical plane against the first and second main surfaces or the first and pn junction interfaces 18, the geometry of the chip can be formed as a substantially cylindrical shape or a substantially rectangular parallelepiped shape—the rectangular parallelepiped shape is preferable—. Furthermore, in the product assembly or packaging process, the rectangular parallelepiped chip can be easily mounted in the assembling jig such as the collets, the burden on the assembling staffs can be drastically reduced.

(Manufacturing Method)

A manufacturing method for the semiconductor diode 10 of the embodiment is explained by using a sequence of process cross-sectional views shown in FIGS. 3A to 3H.

Figure 3A:
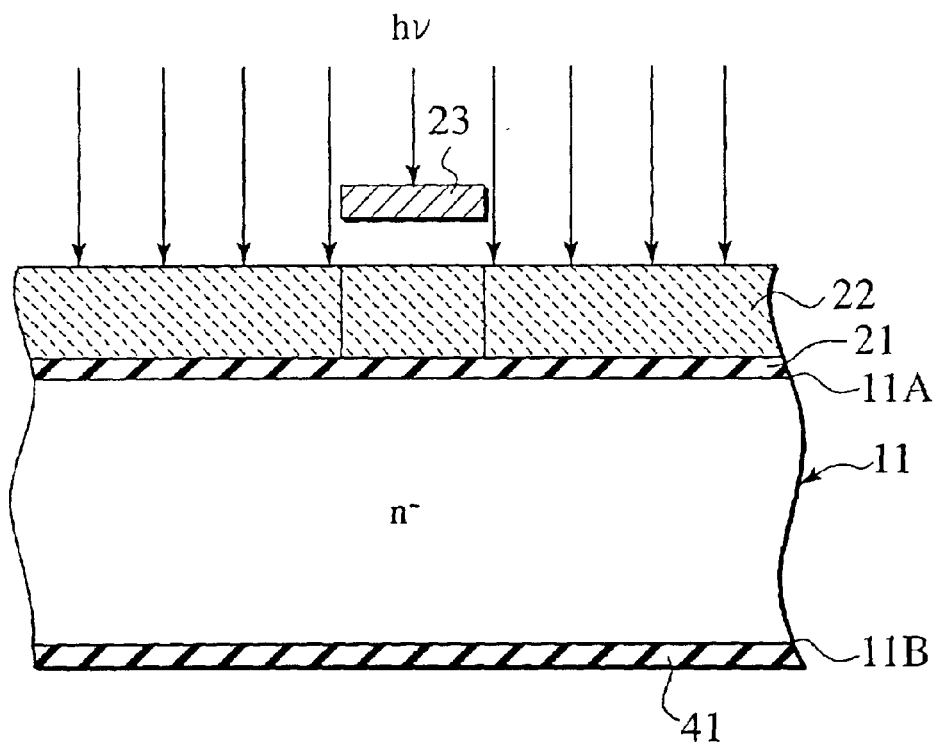
FIGS. 3A to 3H are process cross-sectional views showing a manufacturing method of the semiconductor device according to the embodiment of the present invention, respectively.

(a) As shown in FIG. 3A, a first conductivity type (n-type) silicon substrate (silicon wafer) 11 having the first main surface 11B and the second main surface 11A is prepared. Thermal oxidization is performed on the first main surface 11B and the second main surface 11A of the silicon substrate 11 to form silicon oxide films 21 and 41 with thickness of 300 nm to 1.5 μm respectively. Then, using photolithographic techniques, the silicon oxide film 21 on the second main surface 11A will be delineated as follows: For example, as shown in FIG. 3A, a negative type photoresist 22 is coated on the silicon oxide film 21 by spin coating. Then as shown in FIG. 3A, a photomask having an opaque pattern 23, which corresponds to the pattern for the n-type first semiconductor region 14 and covers a part where an opening 22A described below will be cut in the photoresist 22, is aligned to be irradiated by exposure light h ν. Although a single opaque pattern 23 is disclosed in FIG. 3A, there are many opaque patterns 23 periodically arranged in a matrix form to manufacture many semiconductor diodes 10 on a single silicon wafer 11, in reality.

Figure 3B:
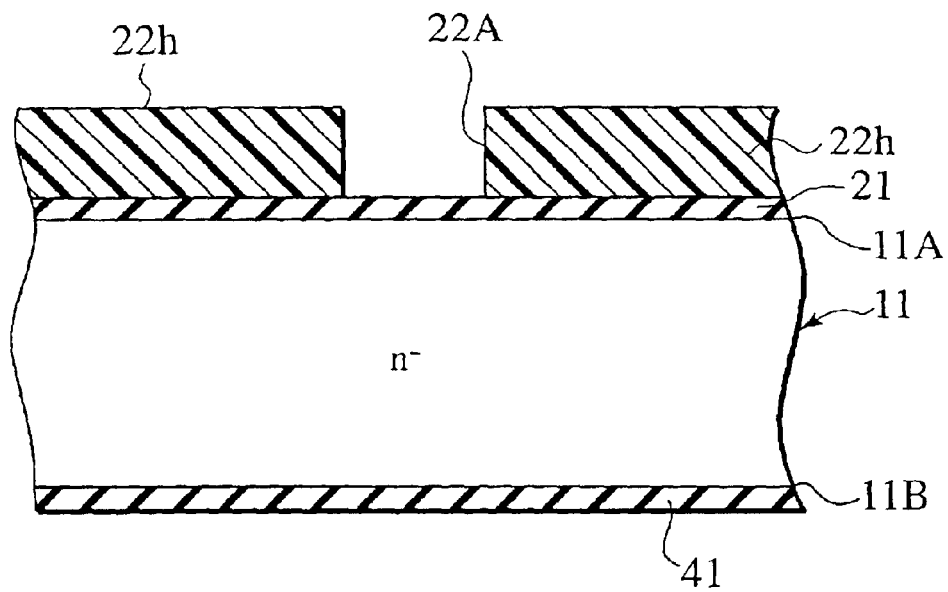
Figure 3C:
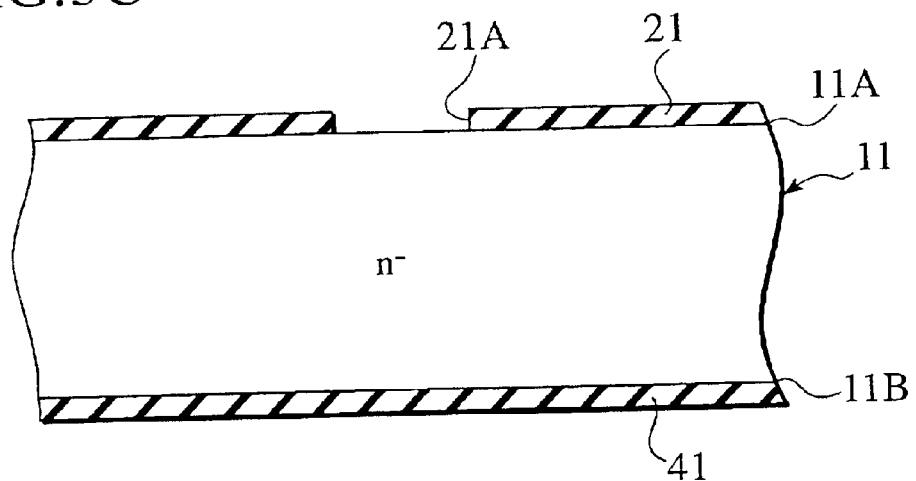

(b) FIG. 3B shows a state having the photoresist 22h developed after the exposure. The photoresist 22h patterned in such a way is used as an etching mask for wet etching or dry etching to selectively remove the silicon oxide film 21, emerging at the bottom of the opening 22A in the photoresist 22h a part of the top surface of the silicon substrate 11. In this case, another photoresist (figure is omitted) is also coated on the silicon oxide film 41 on the first main surface 11B side for protecting the silicon oxide film 41. Then peeling off the photoresist 22h gives a state shown in FIG. 3C. As shown in FIG. 3C, an opening 21A is cut in the silicon oxide film 21 to expose a part of the second main surface 11A. Although a single opening 21A is disclosed in FIG. 3A, there are many openings 21A periodically arranged in a matrix form to manufacture many semiconductor diodes 10 on the silicon wafer 11, in reality.

Figure 3D:
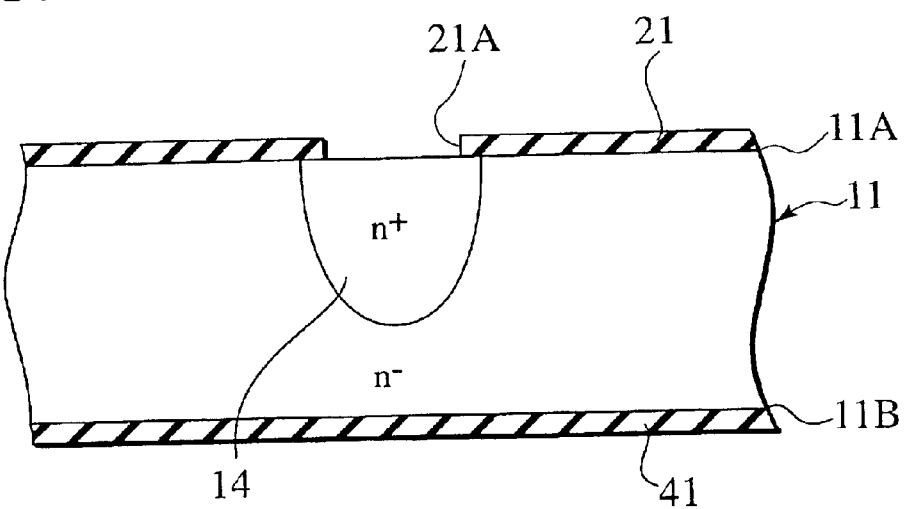

(c) A heavily-impurity-doped thin film such as a phosphorus glass (PSG) film and an arsenic glass (AsSG) film is blanket deposited so as to include the part of the top surface of silicon substrate 11, exposed at the opening 21A in the silicon oxide film 21. The PSG film contains the n-type dopant, or phosphorus (P), and the AsSG film contains arsenic (As). Then, a heat treatment is performed at a predetermined diffusion temperature and for a predetermined diffusion time so as to selectively diffuse the n-type dopant, forming the n-type first semiconductor region 14 having high impurity concentration as shown in FIG. 3D. Although a single first semiconductor region 14 is disclosed in FIG. 3D, there are many first semiconductor regions 14 periodically arranged in a matrix form to manufacture many semiconductor diodes 10 on the silicon wafer 11. Then the impurity—doped thin film is removed. Since a diffusion depth of the first semiconductor region 14 will finally be deep enough to be about half of thickness of the silicon substrate 11, it is preferable to use phosphorus (P), which has high diffusion coefficient, as an n-type impurity elements. Gaseous phase diffusion method using a liquid source such as phosphoryl chloride ($POCl_3$) without using the impurity-doped thin film can be also acceptable. And it is also acceptable to implant impurity ions such as $^{31}P^+$ by a predetermined dose such as $3\times10^{15}$ $cm^{-2}$ to $5\times10^{16}$ $cm^{-2}$, and then to drive-in (heat-treat) them to a desired depth. $^{75}As^+$ can be implanted, however it is not preferable because arsenic (As) has a low diffusion coefficient and needs higher diffusion temperature and longer diffusion time. When the impurity-doped thin film is used, the impurity-doped thin film is afterward wet-etched or dry-etched for removing. Even when the impurity-doped thin film is not used, PSG film formed inside the diffusion window at the time of driving-in is wet etched or dry etched for removing.

Figure 3E:
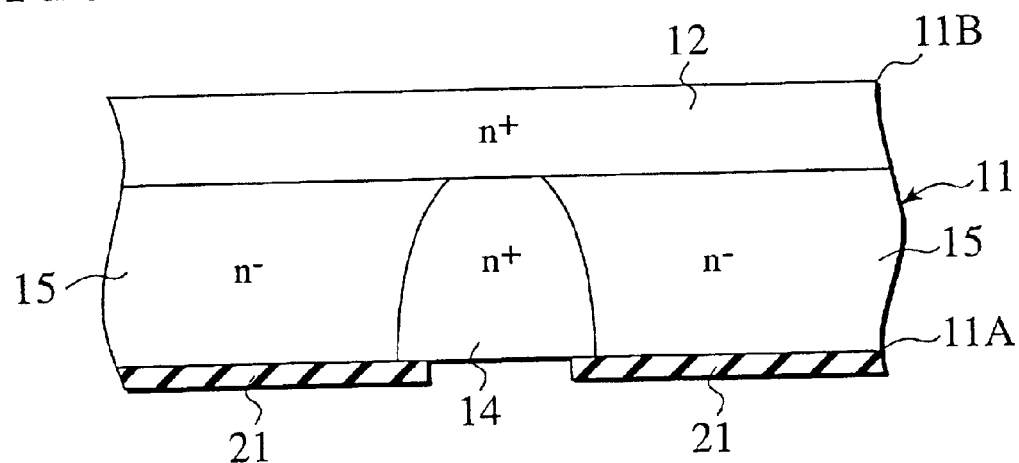
Figure 3F:
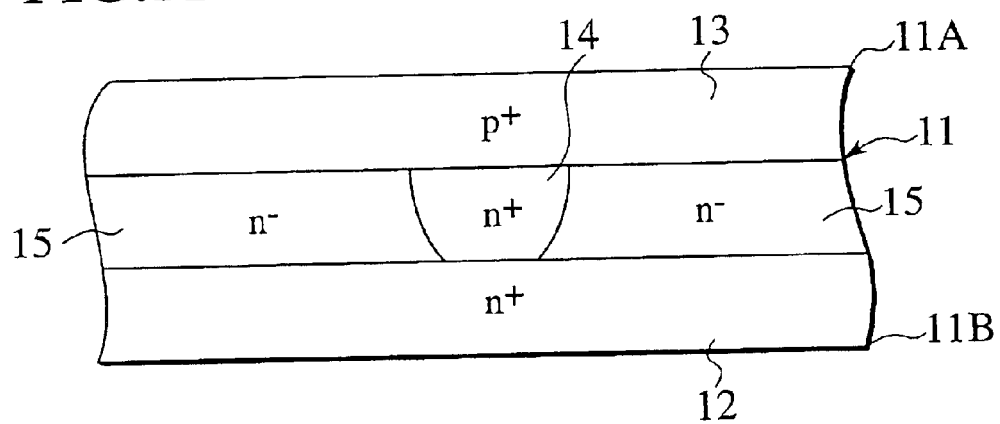

(d) Next, the second main surface 11A of the silicon substrate 11 is coated with the photoresist (figure is omitted) to remove the silicon oxide film 41 on the first main surface 11B of the silicon substrate. Then as shown in FIG. 3E, donor impurities such as phosphorus (P) and arsenic (As) are diffused over the whole of the first main surface 11B of the silicon substrate 11 to form the n-type second semiconductor region 12 having high impurity concentration (e.g. about $2\times10^{19}/cm^3$). At this time, the shallow n-type first semiconductor region 14 in FIG. 3D is pushed deeper so as to form the pn junction between the deep pushed n-type first semiconductor region 14 and the second semiconductor region 12. A region around the n-type first semiconductor region 14 remains as the n-type fourth semiconductor region 15, retaining impurity concentration inherent to the silicon substrate 11. Gaseous phase diffusion method using a liquid source such as $POCl_3$ without using the impurity-doped thin film is also acceptable. And it is also acceptable to implant impurity ions such as $^{31}P^+$, $^{75}As^+$ by a predetermined dose such as $3\times10^{15}$ $cm^{-2}$ to $5\times10^{16}$ $cm^{-2}$ and then to drive-in (heat-treat) it to a desired diffusion depth. In this state, a thin layer made of the silicon substrate 11 can be remained between the first semiconductor region 14 and the second semiconductor region 12. The layer thickness made of the silicon substrate sandwiched between the first semiconductor region 14 and the second semiconductor region 12 is preferably set to be such a thickness that the layer is pushed at the specific time in the process sequence as shown in FIG. 3F, forming the p-type third semiconductor region 13 at the whole second main surface 11A as described below, and the first semiconductor region 14 is finally and completely connected with the second semiconductor region 12. As shown in FIG. 3E, PSG film formed inside diffusion windows of the first main surface 11B and the second main surface 11A of the silicon substrate 11 at the time of driving-in is wet etched or dry etched for removing.

(e) Next, as shown in FIG. 3F, accepter impurity, e.g. boron (B), is blanket diffused along the whole surface from the second main surface 11A of the silicon substrate 11 to form the flat p-type third semiconductor region 13. By driving-in (heat-treating) for forming the flat p-type third semiconductor region 13, tips of the first semiconductor region 14 is still further pushed deeper so that the first semiconductor region 14 is completely connected with the second semiconductor region 12. For the blanket diffusion of accepter impurity to form the flat p-type third semiconductor region 13, a method to use the impurity-doped thin film such as boron glass (BSG) or the gaseous phase diffusion method to use a solid source such as boron nitride (BN) or a liquid source such as boron tribromide ($BBr_3$) will be acceptable. And it is also acceptable to implant impurity ions such as $^{11}B^+$, $^{49}BF_2^+$ with a predetermined dose such as $3\times10^{15}$ $cm^{-2}$ to $5\times10^{16}$ $cm^{-2}$ and then to drive-in (heat-treat) them to a desired diffusion depth. As a result, as shown in FIG. 3F, the n-type first semiconductor region 14 is sandwiched between the p-type third semiconductor region 13 formed at the whole second main surface 11A of the silicon substrate 11 and the n-type second semiconductor region 12 formed at the whole first main surface 11B side. The n-type fourth semiconductor region 15 having impurity concentration inherent to the silicon substrate 11 is formed around the n-type first semiconductor region 14 so that it surrounds the n-type first semiconductor region 14. The n-type first semiconductor region 14 is formed so as to achieve the impurity concentration higher than that of the n-type fourth semiconductor region 15. And the n-type first semiconductor region 14 forms the first pn junction interface 18 with the p-type second semiconductor region 13. Furthermore, the p-type third semiconductor region 13 and the n-type fourth semiconductor region 15 with relatively low impurity concentration are connected with each other to form the second pn junction interface.

Figure 3G:
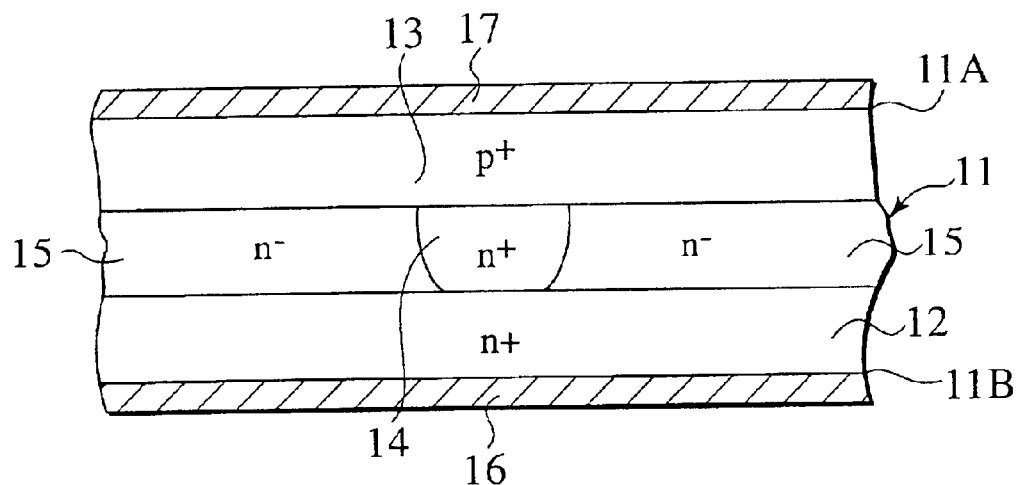

(f) And then, as shown in FIG. 3G, metal thin films are deposited on surfaces of the p-type third semiconductor region 13 and the n-type second semiconductor region 12 by a vacuum evaporation method or a spattering method to form the first main electrode layer 16 and the second main electrode layer 17 with a thickness of 1 μm to 10 μm.

Figure 3H:
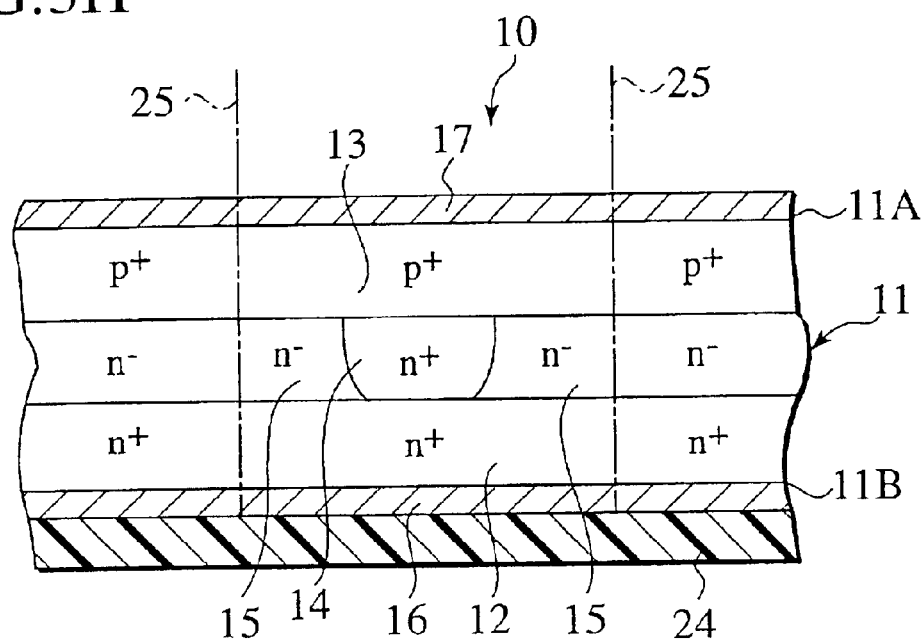

(g) Finally as shown in FIG. 3H, a synthetic resin sheet 24 is stuck over the whole of e.g. the first main surface 11B of the silicon substrate 11 to be cut along dicing lines 25 marked with a dashed line as shown in FIG. 3H. Although only two dicing lines 25 are shown in FIG. 3H, there are many dicing lines 25 prescribed in a matrix form. Namely, although a single semiconductor diode is disclosed in FIG. 3H, many semiconductor diodes periodically arranged in a matrix form are manufactured simultaneously on the silicon wafer 11, in reality. For the synthetic resin sheet 24, a polyethylene film, a polypropylene film, a polyvinyl chloride film, a polyethylene terephthalate film, a polybutylene terephthalate film, a polybutene film, a polybutadiene film, a polyurethane film, a polymethyl pentene film, an ethylene-vinyl acetate copolymer film, an ethylene-(met) acrylic acid copolymer film, an ethylene-(met) acrylic acid methyl copolymer film and an ethylene-(met) acrylic acid ethyl copolymer film can actually be used. The synthetic resin sheet 24 can be a laminated film of these films. Film thickness of the synthetic resin sheet 24 is usually 10 to 300 μm, preferably 50 to 200 μm. The plane cut along the dicing line 25 in this way will become the chip outer-surface 19 as described above. The chips, each formed into the rectangular parallelepiped shape by the cutting process, can respectively be used for the semiconductor diodes 10 shown in FIG. 2. After the cutting process, a plurality of the semiconductor diodes 10 in the rectangular parallelepiped geometry, or the chip state can be stored and carried in a state of being stuck to the synthetic resin sheet 24. Therefore, at the time of packaging process, or the assembling process so as to yield the product, the plurality of semiconductor diodes 10 stuck to the synthetic resin sheet 24 can be handled easily e.g. when they are mounted respectively on a jig such as a collet.

According to the manufacturing method of the semiconductor device of the embodiment, the chip outer-surface 19 of the rectangular parallelepiped semiconductor diode 10 is formed in almost perpendicular to both main surfaces of the silicon substrate 11, as cut by the dicing process. Therefore, several machining processes to form the bevel contour are not needed as in the past and the number of production steps can be greatly reduced.

(First Modification)

Figure 4:
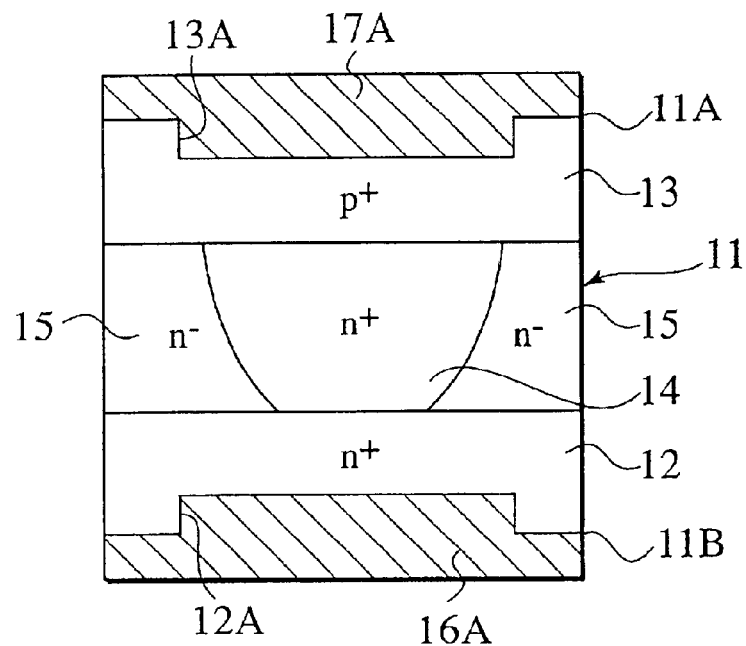
FIG. 4 is a cross-sectional view showing a semiconductor device according to first modification of the embodiment of present invention.

Using the cross-sectional view shown in FIG. 4, another device structure in which a new electrode layer topology is applied to the basic semiconductor diode 10 shown in FIG. 2 is explained as "a first modification" of the embodiment. The overlapped explanations for the identical portion as the structure shown in FIG. 2 will be omitted here.

A first concavity 12A is cut at the first main surface (the bottom surface) 11B of semiconductor diode 10 as shown in FIG. 4. And a modified first main electrode layer 16A is disposed in the first concavity 12A so as to contact with the second semiconductor region 12, implementing an ohmic contact electrode 16A. Further, a second concavity 13A is formed at the second main surface (the top surface) 11A of semiconductor diode 10. And a modified second main electrode layer 17A is disposed in the second concavity 13A so as to contact with the third semiconductor region 13, implementing an ohmic contact electrode 17A.

Between the modified first main electrode layer 16A and the modified second main electrode layer 17A, the principal operation region of the semiconductor device, or the current path for the main current flowing through the semiconductor device is defined. In FIG. 4, the modified first main electrode layer 16A is identified as the cathode electrode layer, since the second semiconductor region 12 is assigned to be n-type, and the modified second main electrode layer 17A is identified as the anode electrode layer on the p-type third semiconductor region 13. In FIG. 4, the second semiconductor region 12 serves as the cathode region, and the third semiconductor region 13 serves as the anode region. Then, the main current identified between the modified first main electrode layer 16A and the modified second main electrode layer 17A conducts through the current path made of the first semiconductor region 14 having low resistance, in the structure shown in FIG. 4.

That is to say, in the semiconductor diode 10 according to the first modification, the modified first main electrode layer 16A at the first main surface 11B and the modified second main electrode layer 17A at the second main surface 11A are embedded in the first concavity 12A formed in the n-type second semiconductor region 12 and the second concavity 13A formed in the p-type third semiconductor region 13, respectively. By forming the first concavity 12A in the n-type second semiconductor region 12 and the second concavity 13A in the p-type third semiconductor region 13, it becomes possible to increase the effective contact areas of the modified first main electrode layer 16A and the modified second main electrode layer 17A, by adjusting the depths of the first concavity 12A and the second concavity 13A, respectively.

The first concavity 12A and the second concavity 13A can be cut easily and simply by using well known techniques such wet etching or dry etching.

(Second Modification)

Figure 5:
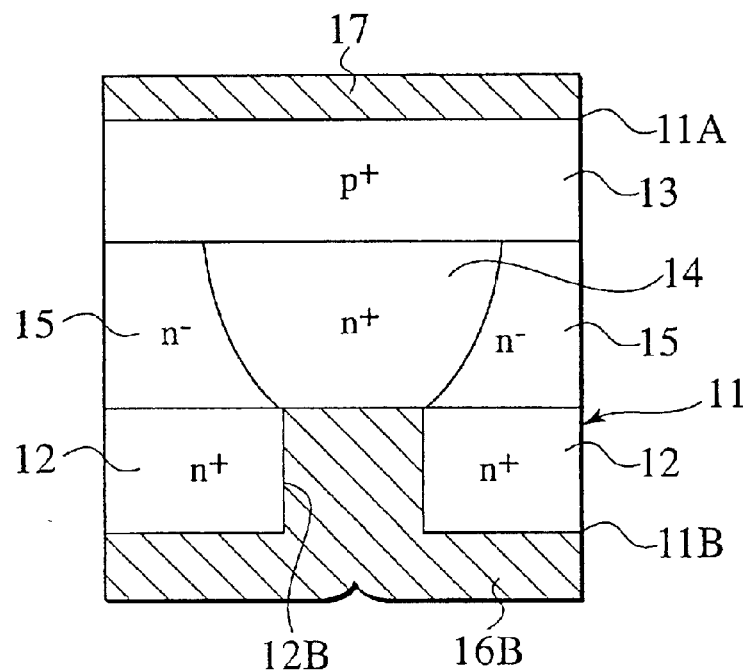
FIG. 5 is a cross-sectional view showing a semiconductor device according to second modification of the embodiment of present invention.

Using a cross-sectional view shown in FIG. 5, still another device structure in which still new electrode layer topology is applied to the basic semiconductor diode 10 shown in FIG. 2 is explained as "a second modification" of the embodiment. The overlapped explanations for the identical portion as the structure shown in FIG. 2 will be omitted here.

In the semiconductor diode 10 according to the second modification, a via hole 12B penetrating through the n-type second semiconductor region 12 is formed at the second main surface 11B of the silicon substrate 11 so as to expose a part of the bottom surface, or the second end surface of the n-type first semiconductor region 14. And a modified first main electrode layer 16B is formed in the via hole 12B, with the deposition of a metallic thin film. The modified first main electrode layer 16B may made of refractory metals such as tungsten (W), titanium (Ti), molybdenum (Mo) or refractory metal silicides (such as $WSi_2$, $TiSi_2$, $MoSi_2$), etc. by using sputtering or CVD method, etc. Further, the impurity doped polysilicon film or the polycide film, which is the composite membrane of the doped polysilicon film and these silicide film can be employed as the material for the modified first main electrode layer 16B. By forming such the modified first main electrode layer 16B, the technical advantage that the modified first main electrode layer 16B can contact directly to the heavily doped n-type first semiconductor region 14 so as to obtain very low resistance, is achieved. In FIG. 5, the principal operation region, or the current path for the main current flowing through the semiconductor device is defined in the modified first main electrode layer 16B and the second main electrode layer 17. Then, the n-type second semiconductor region 12 is identified as the cathode electrode layer contacted to the modified first main electrode layer 16B, and the p-type third semiconductor region 13 is identified as the anode electrode layer contacted to the second main electrode layer 17. In second modification, the first semiconductor region 14 becomes the effective cathode region, while the second semiconductor region 12 does not substantially serve as the cathode region, because the modified first main electrode layer 16B shown in FIG. 5 does the ohmic contact directly with the first semiconductor region. In the meantime, the third semiconductor region 13 serves as the anode region equal to the basic structure shown in FIG. 2. Then, the main current identified between the modified first main electrode layer 16B and the second main electrode layer 17 flows through the first semiconductor region 14 having the low resistivity serving as the current path in the structure shown in FIG. 5.

The other structure not explained here, the function, the operation, or the effectiveness of the semiconductor diode according to the second modification are essentially similar to the embodiment shown in FIG. 2, respectively.

Other Embodiments

Various modifications will become possible for those skilled in the art after receiving the teaching of the present disclosure without departing from the scope thereof. For example, in the description of the embodiment, though it was explained as if the semiconductor diode 10 is suitable for the voltage regulator diode, of course, it is also possible to apply the present invention to power semiconductor devices operating with higher breakdown voltages than the voltage regulator diode. Of course, it is also possible to use the p-type silicon substrate 11, though the semiconductor diode 10 was implemented by the n-type silicon substrate 11 in the description of the embodiment.

In addition, though the first and second conductivity types were assigned as n-type and p-type, respectively, p-type can be assigned for the first conductivity type and n-type for the second conductivity type.

It is also possible to introduce n-type impurity elements through the first main surface 11B so as to form the first semiconductor region 14, though the first semiconductor region 14 was made by the selective diffusion of n-type impurity elements through the second main surface 11A of the silicon substrate 11. Thus, the present invention of course includes various embodiments and modifications and the like which are not detailed above. Therefore, the scope of the present invention will be defined in the following claims.

What is claimed is:

1. A semiconductor device comprising:
   a first semiconductor region of a first conductivity type, defined by an upper end surface, a lower end surface opposing to the upper end surface, and first and second side boundary surfaces connecting the upper and lower end surfaces when viewed in section;
   a second semiconductor region of the first conductivity type having top and bottom surfaces, disposed under the first semiconductor region, a portion of the surface being in contact with the lower end surface of said first semiconductor region so as to share a common boundary surface by the first and second semiconductor regions, wherein a first concavity is cut into the bottom surface of the second semiconductor region;
   a third semiconductor region of a second conductivity type disposed on the first semiconductor region and being in contact with the upper end surface of said first semiconductor region;
   a fourth semiconductor region having first and second inner surfaces in contact with the first and second side boundary surfaces respectively when viewed in section and an impurity concentration lower than said first semiconductor region, configured such that the fourth semiconductor region is disposed between the second and third semiconductor regions; and
   a first main electrode layer being in contact with the bottom surface of the second semiconductor region, a part of the first main electrode layer being buried in the first concavity.

2. The semiconductor device of claim 1, wherein said fourth semiconductor region has the first conductivity type.

3. The semiconductor device of claim 1, wherein outer surface of said fourth semiconductor region serves as a chip outer-surface of the semiconductor device and the chip outer-surface is substantially orthogonal with the lower end surface of said first semiconductor region.

4. The semiconductor device of claim 1, wherein said fourth semiconductor region is made of a wafer cut from bulk crystal.

5. A semiconductor device of comprising:
   a first semiconductor region of a first conductivity type, defined by an upper end surface, a lower end surface opposing to the upper end surface, and first and second side boundary surfaces connecting the upper and lower end surfaces when viewed in section;
   a second semiconductor region of the first conductivity type having top and bottom surfaces, disposed under the first semiconductor region, a portion of the top surface being in contact with the lower end surface of said first semiconductor region so as to share a common boundary surface by the first and second semiconductor regions;
   a third semiconductor region of a second conductivity type disposed on the first semiconductor region and being in contact with the upper end surface of said first semiconductor region;
   a fourth semiconductor region having a first and second inner surfaces in contact with the first and second side boundary surfaces respectively when viewed in section and an impurity concentration lower than said first semiconductor region, configured such that the fourth semiconductor region is disposed between the second and third semiconductor regions; and
   a first main electrode layer being in contact with the bottom surface of the second semiconductor region, wherein the second semiconductor region has a via hole and a part of the first main electrode layer is buried in the via hole penetrating through said second semiconductor region, configured such that the buried part of the first main electrode layer contacts with said first semiconductor region.

6. The semiconductor device of claim 1, further comprising a second main electrode layer formed on a top surface of said third semiconductor region.

7. The semiconductor device of claim 6, wherein said second main electrode layer is contacted with said third semiconductor region, through a second concavity formed at the top surface of said third semiconductor region.

* * * * *